(12) United States Patent
Koshiyama et al.

(10) Patent No.: US 9,244,358 B2
(45) Date of Patent: Jan. 26, 2016

(54) SURFACE TREATMENT LIQUID, SURFACE TREATMENT METHOD, HYDROPHOBILIZATION METHOD, AND HYDROPHOBILIZED SUBSTRATE

(75) Inventors: Jun Koshiyama, Kawasaki (JP); Kazumasa Wakiya, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 1140 days.

(21) Appl. No.: 13/123,341

(22) PCT Filed: Sep. 15, 2009

(86) PCT No.: PCT/JP2009/066086
§ 371 (c)(1),
(2), (4) Date: Apr. 8, 2011

(87) PCT Pub. No.: WO2010/047196
PCT Pub. Date: Apr. 29, 2010

(65) Prior Publication Data
US 2011/0195190 A1    Aug. 11, 2011

(30) Foreign Application Priority Data

Oct. 21, 2008  (JP) ................................. 2008-270556
Nov. 28, 2008  (JP) ................................. 2008-305719

(51) Int. Cl.
| | | |
|---|---|---|
| C09K 3/18 | (2006.01) | |
| G03F 7/40 | (2006.01) | |
| H01L 23/29 | (2006.01) | |
| G03F 7/16 | (2006.01) | |
| H01L 21/306 | (2006.01) | |
| G03F 7/20 | (2006.01) | |

(52) U.S. Cl.
CPC . *G03F 7/405* (2013.01); *C09K 3/18* (2013.01); *G03F 7/16* (2013.01); *H01L 21/306* (2013.01); *H01L 23/296* (2013.01); *G03F 7/2041* (2013.01)

(58) Field of Classification Search
CPC ....... H01L 21/306; H01L 23/296; C09K 3/18
USPC .......................................... 106/287.1, 287.11
See application file for complete search history.

(56) References Cited

U.S. PATENT DOCUMENTS

| | | | | |
|---|---|---|---|---|
| 4,898,907 A * | 2/1990 | Haluska | ............... | C04B 41/5035 106/287.1 |
| 5,429,673 A * | 7/1995 | Peterson et al. | .......... | 106/287.11 |
| 5,702,767 A | 12/1997 | Peterson et al. | | |
| 5,747,561 A * | 5/1998 | Smirnov et al. | ................ | 523/212 |
| 6,156,223 A * | 12/2000 | Sigel et al. | ....................... | 252/62 |
| 6,165,907 A * | 12/2000 | Yoneda et al. | ................ | 438/706 |
| 6,258,972 B1 | 7/2001 | Nakaoka et al. | | |
| 7,741,260 B2 | 6/2010 | Koshiyama et al. | | |
| 2008/0026975 A1 | 1/2008 | Koshiyama et al. | | |
| 2013/0255534 A1* | 10/2013 | Ryokawa | ............... | H01L 23/296 106/2 |

FOREIGN PATENT DOCUMENTS

| | | |
|---|---|---|
| CN | 1947066 A | 4/2007 |
| EP | 0 757 290 A2 | 2/1997 |
| JP | S56-49526 | 5/1981 |
| JP | S60-25231 | 2/1985 |
| JP | S62-187845 | 8/1987 |
| JP | S62-211643 | 9/1987 |
| JP | S62-261123 | 11/1987 |
| JP | H05-021335 | 1/1993 |
| JP | H05-299336 | 11/1993 |
| JP | H06-163391 | 6/1994 |
| JP | H07-142349 | 6/1995 |
| JP | H08-255736 | 10/1996 |
| JP | H09-102458 | 4/1997 |
| JP | H09-306822 | 11/1997 |
| JP | H10-041213 | 2/1998 |
| JP | H11-511900 | 10/1999 |
| JP | 2005-114973 | 4/2005 |
| JP | 2006-145897 | 6/2006 |
| JP | 2007-19465 | 1/2007 |
| JP | 2008-209433 | 9/2008 |
| JP | 2008-235542 | 10/2008 |
| WO | WO2005/103831 | 11/2005 |

OTHER PUBLICATIONS

Notice of Reasons for Rejection issued in Japanese Patent Application No. 2008-270556, mailed Oct. 29, 2013.
International Search Report issued in corresponding PCT Application No. PCT/JP2009/066086, mailed Dec. 22, 2009.
Gil, et al., "First Microprocessors with Immersion Lithography," (2005) *Proceedings of SPIE*, 5754:119-128.
Office Action in corresponding Taiwanese Patent Application No. TW 098134517, mailed Aug. 22, 2014.

\* cited by examiner

*Primary Examiner* — David M Brunsman
(74) *Attorney, Agent, or Firm* — Knobbe Martens Olson & Bear LLP

(57) ABSTRACT

Disclosed is a surface treatment liquid which enables simple and efficient hydrophobilization of a substrate and prevention of collapse of a resin pattern or etched pattern. Also disclosed are a surface treatment method using the surface treatment liquid, a hydrophobilization method using the surface treatment liquid, and a hydrophobilized substrate. When a substrate is hydrophobilized, the substrate is coated with a surface treatment liquid containing a silylating agent and a hydrocarbon non-polar solvent. When a pattern is prevented from collapse, the surface of a resin pattern formed on a substrate or etched pattern formed on a substrate by etching is treated using a surface treatment liquid containing a silylating agent and a solvent.

8 Claims, 1 Drawing Sheet

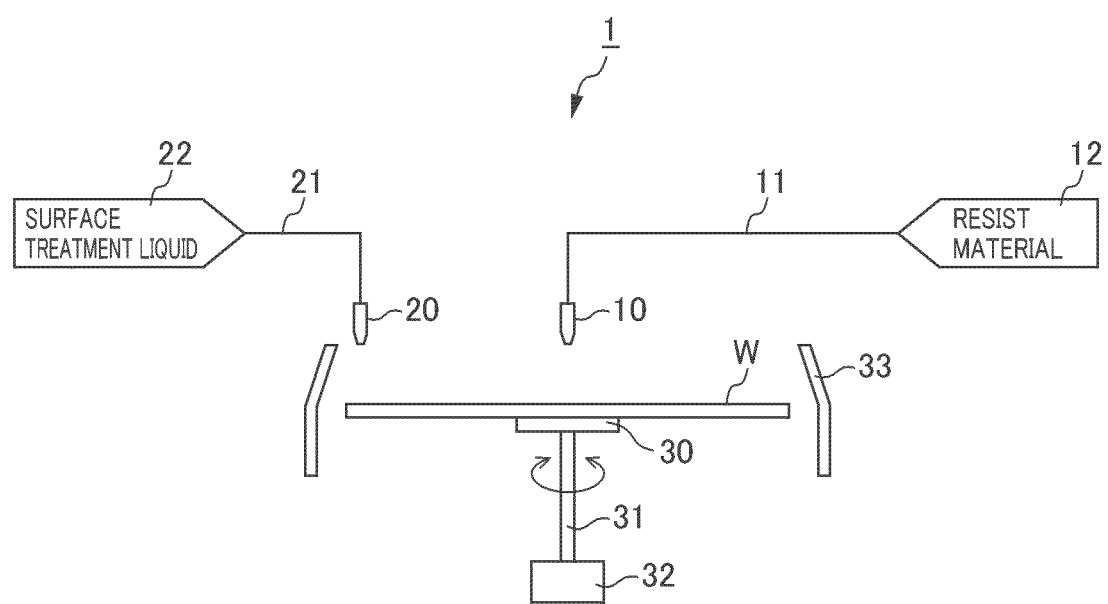

SURFACE TREATMENT LIQUID, SURFACE TREATMENT METHOD, HYDROPHOBILIZATION METHOD, AND HYDROPHOBILIZED SUBSTRATE

RELATED APPLICATIONS

This application is the U.S. National Phase filing under 35 U.S.C. §371 of PCT/JP2009/066086, filed Sep. 15, 2009, which designated the United States and was published in a language other than English, which claims priority under 35 U.S.C. §119(a)-(d) to Japanese Patent Application Number 2008-270556, filed on Oct. 21, 2008, and Japanese Patent Application Number 2008-305719, filed on Nov. 28, 2008. The content of these applications is incorporated herein by reference in their entireties.

TECHNICAL FIELD

The present invention relates to a surface treatment liquid for use in hydrophobilization and the like of a substrate, a surface treatment method carried out using the surface treatment liquid, a hydrophobilization method carried out using the surface treatment liquid, and a hydrophobilized substrate.

BACKGROUND ART

Lithography methods have been frequently used for the production of fine features in various kinds of electronic devices, such as semiconductor devices. In recent years, as the device features are further miniaturized, miniaturized resist patterns with increased aspect ratio in lithography processes have been also desired. For attaining the formation of such a fine pattern, a first step is to improve a lithography device and to develop a corresponding resist. Common factors to consider for developing the lithography device include shortening of wavelengths of light sources such as $F_2$ excimer laser, EUV (extreme UV light), electron beam, X-ray, soft X-ray and the like, and increases in numerical aperture (NA) of lens.

On the other hand, shortening the wavelengths of the light sources requires a new and expensive aligner (lithography device). In addition, a problem arises in that a focal depth width is reduced even if the resolution property is improved because a trade-off lies between the resolution and the focal depth width when the NA of lens is increased.

Accordingly, as a lithography technique for solving such problems, liquid immersion lithography (hereinafter, may be also referred to as "liquid immersion exposure") was proposed (see Nonpatent Document 1). In the liquid immersion exposure, a liquid (liquid immersion medium) having a refractive index higher than that of air is placed between an objective lens of the lithography device and a resist film (or resist protective film), and then the exposure (immersion exposure) is carried out. Regarding such liquid immersion exposure, a high resolution can be reportedly achieved even when a light source with the same exposure wavelength is used, similarly to the case in which a light source with a shorter wavelength and in which a high NA lens is used, and also a decrease in the focal depth width is not reportedly resulted. Additionally, the liquid immersion exposure can be carried out using a preexisting lithography device. Therefore, the liquid immersion exposure is expected to be capable of realizing formation of resist patterns with a high resolution and also with favorable focal depth width at low cost. Thus, it has drawn great attention in manufacturing semiconductor elements which require a large amount of investment in equipment, owing to great effects exerted on semiconductor industry in terms of cost, as well as lithography characteristics such as resolution.

The liquid immersion exposure is efficacious in forming any pattern configuration, and further it is reportedly possible to use it in combination with a super-resolution technique currently being investigated such as a phase shift method, a modified illumination method or the like. At present, techniques in which an ArF excimer laser is employed as a light source have been mainly studied actively as the liquid immersion exposure technique. In addition, water has been predominantly investigated currently as the liquid immersion medium.

In liquid immersion exposure, for example, water is placed as a liquid immersion medium between an objective lens of the lithography device and a resist film (or resist protective film); therefore, there is an envisaged problem that water runs around the edge portion (outer edge) or the back face of the substrate. In order to prevent such running of water, it is efficacious to hydrophobilize the substrate.

Conventionally, as a method for hydrophobilizing a substrate, a vapor treatment by means of hexamethyldisilazane (HMDS) with bubbling of nitrogen has been extensively adopted (see Patent Document 1). Also, for the purpose of further increasing hydrophobicity, a method carried out using a silylating agent having an alkyl group or alkenyl group substituted with fluorine in place of HMDS was proposed (see Patent Document 2).

However, the vapor treatment with a silylating agent as in Patent Documents 1 and 2 is hardly recognized as being a simple method since it necessitates heating, bubbling of nitrogen or the like. In addition, the center section of a substrate is often provided with an inorganic bottom antireflective coating (inorganic BARC) or an organic bottom antireflective coating (organic BARC), and hydrophobilization of such a section is believed to be unnecessary. In this regard, the vapor treatment with a silylating agent is not efficacious since such a section on which hydrophobilization is not required is also subjected necessarily to the treatment.

Furthermore, a problem of pattern collapse, generally referred to, is marked as further miniaturized resist patterns with increased aspect ratio in lithography processes are provided. The pattern collapse means an event that occurs in forming a large number of resin patterns in parallel on a substrate, in which adjacent resin patterns get close such that they lean to each other, and the resin patterns may be broken off or detached from the basal part in some cases. Occurrence of the pattern collapse leads to failure in obtaining desired products, thereby resulting in deterioration of the yield and decrease in reliability of the products.

Moreover, the problem of pattern collapse recently arises not only on resin patterns but also on etched patterns.

The pattern collapse has been known to be caused in a washing treatment following the pattern formation when the washing liquid dries, owing to the surface tension of the washing liquid. In other words, when the washing liquid is removed off in the drying step, a stress resulting from the surface tension of the washing liquid acts between the patterns, and thus the pattern collapse occurs.

Therefore, many efforts have been made hitherto for preventing pattern collapse by adding a substance for decreasing the surface tension to the washing liquid. For example, washing liquids containing isopropyl alcohol, washing liquids containing a fluorochemical surfactant, and the like were proposed (see Patent Document 3 and 4).

However, only the ingenuity of the washing liquid as proposed in Patent Documents 3 and 4 has involved the problem of insufficiently achieved prevention of pattern collapse.

Patent Document 1: Japanese Unexamined Patent Application, Publication No. S60-25231
Patent Document 2: Japanese Unexamined Patent Application, Publication No. 2007-19465
Patent Document 3: Japanese Unexamined Patent Application, Publication No. H6-163391
Patent Document 4: Japanese Unexamined Patent Application, Publication No. H7-142349
Nonpatent Document 1: Proceedings of SPIE, Vol. 5754, pp. 119-128 (2005)

DISCLOSURE OF THE INVENTION

Problems to be Solved by the Invention

The present invention was made in view of such existing circumstances, and an object of the invention is to provide a surface treatment liquid which enables simple and efficient hydrophobilization of a substrate, or efficacious prevention of collapse of a resin pattern or etched pattern. An additional object of the present invention is to provide a surface treatment method carried out using the surface treatment liquid, a hydrophobilization method carried out using the surface treatment liquid, and a hydrophobilized substrate.

Means for Solving the Problems

The present inventors thoroughly investigated in order to solve the foregoing problems. As a consequence, it was found that a surface treatment liquid prepared by diluting a silylating agent in a solvent enables only a section on which hydrophobilization is required, for example, only an outer edge of a substrate, to be hydrophobilized. Furthermore, when a silylating agent is diluted in a common solvent and applied on a substrate, the degree of hydrophobilization significantly deteriorates as compared with the case in which a vapor treatment is carried out, but it was found that a high degree of hydrophobilization comparative to the case of the vapor treatment is attained when a silylating agent is diluted in a particular solvent and applied on a substrate.

In addition, the present inventors found that efficacious prevention of collapse of a resin pattern or etched pattern is enabled by subjecting the surface of the resin pattern or etched pattern to a treatment with a surface treatment liquid containing a silylating agent and a solvent to permit hydrophobilization, thereby increasing the contact angle of the washing liquid.

The present invention was made on the basis of these findings, and specific aspects of the invention are as in the following.

A first aspect of the present invention provides a surface treatment liquid used for hydrophobilizing a substrate, including a silylating agent, and a hydrocarbon-based nonpolar solvent.

A second aspect of the present invention provides a hydrophobilization method including applying the surface treatment liquid according to the first aspect of the present invention on a substrate to permit hydrophobilization.

A third aspect of the present invention provides a substrate hydrophobilized by the hydrophobilization method according to the second aspect of the present invention.

A fourth aspect of the present invention provides a surface treatment method including: subjecting a surface of a resin pattern provided on a substrate, or an etched pattern formed on a substrate by etching, to a treatment with a surface treatment liquid containing a silylating agent and a solvent; and washing the resin pattern or the etched pattern treated with the surface treatment liquid.

A fifth aspect of the present invention provides a surface treatment liquid which includes a silylating agent and a solvent, and which is used in the surface treatment method according to the fourth aspect of the present invention.

Effects of the Invention

According to the present invention, a surface treatment liquid which enables simple and efficient hydrophobilization of a substrate, or efficacious prevention of collapse of a resin pattern or etched pattern, as well as a surface treatment method carried out using the surface treatment liquid, a hydrophobilization method carried out using the surface treatment liquid, and a hydrophobilized substrate can be provided.

BRIEF DESCRIPTION OF THE DRAWINGS

FIG. 1 shows a view illustrating a construction of a main part of a substrate treatment apparatus capable of spin coating a surface treatment liquid only on the outer edge of a substrate.

EXPLANATION OF REFERENCE NUMERALS 1 substrate treatment apparatus
10 application nozzle
11 piping
12 resist material supply source
20 application nozzle
21 piping
22 surface treatment liquid supply source
30 spin chuck
31 motor axis
32 motor
33 cup
W substrate

PREFERRED MODE FOR CARRYING OUT THE INVENTION

First Embodiment

Surface Treatment Liquid

The surface treatment liquid in the first embodiment contains a silylating agent, and a hydrocarbon-based nonpolar solvent. Hereafter, each component will be described in detail.

Silylating Agent

The surface treatment liquid in the first embodiment contains a silylating agent for hydrophobilizing the surface of a substrate.

The silylating agent is not particularly limited, and any conventionally well-known silylating agent may be used. Specifically, for example, the silylating agent represented by the following formulae (1) to (3) may be used.

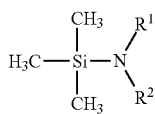

In the formula (1), $R^1$ represents a hydrogen atom, or a saturated or unsaturated alkyl group; $R^2$ represents a saturated or unsaturated alkyl group, a saturated or unsaturated cycloalkyl group, or a saturated or unsaturated heterocycloalkyl group; and $R^1$ and $R^2$ may link to each other to form a saturated or unsaturated heterocycloalkyl group having a nitrogen atom.

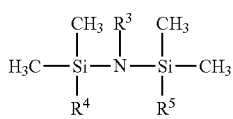

In the formula (2), $R^3$ represents a hydrogen atom, a methyl group, a trimethylsilyl group, or a dimethylsilyl group; and $R^4$ and $R^5$ each independently represent a hydrogen atom, a methyl group, an alkyl group, or a vinyl group.

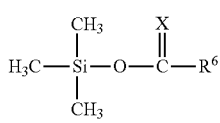

In the formula (3), X represents O, $CHR^7$, $CHOR^7$, $CR^7R^7$, or $NR^8$; $R^6$ and $R^7$ each independently represent a hydrogen atom, a saturated or unsaturated alkyl group, a saturated or unsaturated cycloalkyl group, a trialkylsilyl group, a trialkylsiloxy group, an alkoxy group, a phenyl group, a phenethyl group, or an acetyl group; and $R^8$ represents a hydrogen atom, an alkyl group, or a trialkylsilyl group.

Examples of the silylating agent represented by the above formula (1) include N,N-dimethylaminotrimethylsilane, N,N-diethylaminotrimethylsilane, t-butylaminotrimethylsilane, allylaminotrimethylsilane, trimethylsilylacetamide, trimethylsilylpiperidine, trimethylsilylimidazole, trimethylsilylmorpholine, 3-trimethylsilyl-2-oxazolidinone, trimethylsilylpyrazole, trimethylsilylpyrrolidine, 2-trimethylsilyl-1,2,3-triazole, 1-trimethylsilyl-1,2,4-triazole, and the like.

Further, examples of the silylating agent represented by the above formula (2) include hexamethyldisilazane, N-methylhexamethyldisilazane, 1,2-di-N-octyltetramethyldisilazane, 1,2-divinyltetramethyldisilazane, heptamethyldisilazane, nonamethyltrisilazane, tris(dimethylsilyl)amine, and the like.

Moreover, examples of the silylating agent represented by the above formula (3) include trimethylsilyl acetate, trimethylsilyl propionate, trimethylsilyl butyrate, trimethylsilyloxy-3-penten-2-one, and the like.

Of these, N,N-dimethylaminotrimethylsilane (DMATMS) is preferred in view of possibility to increase the hydrophobicity of the substrate. The DMATMS is capable of even further increasing the hydrophobicity of the substrate as compared with conventionally used HMDS in general.

The content of the silylating agent in the surface treatment liquid is preferably 0.1 to 50% by mass, more preferably 0.5 to 30% by mass, and still more preferably 1.0 to 20% by mass. When the content falls within the above range, hydrophobicity of the substrate can be sufficiently increased while coating properties of the surface treatment liquid are maintained.

Hydrocarbon Based Nonpolar Solvent

The surface treatment liquid according to first embodiment contains a hydrocarbon-based nonpolar solvent for diluting the silylating agent. Using the hydrocarbon-based nonpolar solvent as a solvent for diluting the silylating agent enables the degree of hydrophobilization to be elevated which is attained by treating the substrate. On the other hand, when a polar solvent having a carbonyl group, an ester bond, a hydroxyl group or a carboxyl group such as cyclohexanone, propylene glycol monomethyl ether acetate (PGMEA) and ethyl lactate is used, the degree of hydrophobilization is significantly lowered even if the same silylating agent is used due to high reactivity of the silylating agent to cause a reaction with the polar solvent.

Examples of the hydrocarbon-based nonpolar solvent include linear, branched, or cyclic hydrocarbon-based solvents, aromatic hydrocarbon-based solvents, terpene-based solvents, and the like. Of these, linear or branched hydrocarbon-based solvents having 6 to 12 carbon atoms, or terpene-based solvent are preferred.

Examples of the linear or branched hydrocarbon-based solvent having 6 to 12 carbon atoms include n-hexane, n-heptane, n-octane, n-nonane, methyloctane, n-decane, n-undecane, n-dodecane, and the like.

Also, examples of the terpene-based solvent include menthanes such as p-menthane, o-menthane and m-menthane, terpinenes such as diphenylmenthane, limonene, α-terpinene, β-terpinene, and γ-terpinene, bornane, norbornane, pinane, pinenes such as α-pinene and β-pinene, monoterpenes such as carane and longifolene, diterpenes such as abietane, and the like.

In particular, linear hydrocarbon-based solvents having 7 to 10 carbon atoms, menthane, and pinane are preferred since superior effects of the present invention are achieved.

These hydrocarbon-based nonpolar solvents may be used alone or in any combination of two or more.

Hydrophobilization Method

According to the hydrophobilization method in the first embodiment, the surface treatment liquid in the first embodiment is applied on a substrate to permit hydrophobilization. Since the surface treatment liquid in the first embodiment is in the state of a solution, hydrophobilization of a substrate can be carried out by a simple method such as spin coating or the like. In addition, hydrophobilization of only a section on which hydrophobilization is required, for example, only the outer edge of the substrate is also enabled.

As the substrate, substrates constituted with Si, $SiO_2$, SiON, SiN, p-Si, α-Si, W, W—Si, Al, Cu, Al—Si or the like may be exemplified. In particular, silicon wafers are preferred.

Although the method for applying the surface treatment liquid on a substrate is not particularly limited, spin coating is preferred. When applied, the surface treatment liquid may be applied on the entire surface of a substrate; however, since an inorganic bottom antireflective coating (inorganic BARC) or an organic bottom antireflective coating (organic BARC) is generally formed on the substrate center section, the hydrophobilization of this section is not required as described above. Accordingly, the surface treatment liquid is preferably spin-coated only on the outer edge. Particularly, in the case of a silicon wafer, spin coating on the slope of the wafer end (i.e., bevel) is preferred. It is to be noted that the term "outer edge" as referred to herein has a meaning indicating one or both the substrate end face (lateral face) and the margin of the substrate upper face (about 3 mm from the outer periphery).

For reference, construction of a main part of a substrate treatment apparatus capable of spin-coating the surface treatment liquid only on the outer edge of a substrate is shown in FIG. 1. In FIG. 1, a circular substrate W is substantially horizontally held by a spin chuck 30. A motor axis 31 of a motor 32 is vertically provided at the center of the under face side of the spin chuck 30. By driving the motor 32 to rotate the motor axis 31 in a forward direction or reverse direction, the spin chuck 30 and the substrate W held thereby are rotated on a horizontal plane.

The substrate treatment apparatus 1 is provided with a cup 33 for receiving and recovering the resist material and the surface treatment liquid which may scatter from the substrate W rotated during the application. The cup 33 is provided so as to be movable up and down relative to the spin chuck 30, and when the resist material or the surface treatment liquid is applied on the substrate W, the cup 33 is positioned around the substrate W held by the spin chuck 30, as shown in FIG. 1. In this state, the resist material and the surface treatment liquid that scatter from the rotating substrate W are received by the inner wall face of the cup 33, and then lead to the outlet positioned downward (not shown in the FIGURE). In addition, when a convey robot provided outside conducts carrying in/out of the substrate W to/from the substrate treatment apparatus 1, the spin chuck 30 protrudes from the top edge of the cup 33.

An application nozzle 10 that discharges the resist material is connected to communicate to a resist material supply source 12 via a piping 11. A filter, a pump, a magnetic valve and the like (all not shown in the FIGURE) are inserted along the piping 11. The application nozzle 10 is constructed such that the resist material can be put on the substrate W in the vicinity of the center when the substrate W is held by the spin chuck 30.

On the other hand, the application nozzle 20 that discharges the surface treatment liquid is connected to communicate to the surface treatment liquid supply source 22 via a piping 21. A filter, a pump, a magnetic valve and the like (all not shown in the FIGURE) are inserted along the piping 21. The application nozzle 20 is constructed such that the surface treatment liquid can put on the substrate W at outer edge when the substrate W is held by the spin chuck 30. It is to be noted that the application nozzle 20 is preferably provided for exclusive use for the surface treatment liquid as in the first embodiment; however, when an EBR application nozzle used for an EBR (Edge Bead Remover) treatment can be diverted, the EBR application nozzle may be also used as the application nozzle 20.

When the substrate W is hydrophobilized, the surface treatment liquid may be discharged from the application nozzle 20 to the outer edge of the substrate W while rotating the substrate W by the motor 32. Accordingly, the point at which the discharged surface treatment liquid is put moves along the outer edge of the substrate W held by the spin chuck 30, whereby the outer edge is hydrophobilized.

Method for Forming Resist Pattern

A substrate hydrophobilized by the hydrophobilization method according to the first embodiment is suitable for forming a resist pattern on a substrate by liquid immersion exposure. Therefore, a method for forming a resist pattern in which a resist pattern is formed on a substrate by the liquid immersion exposure will be explained below.

For forming a resist pattern on a substrate by liquid immersion exposure, a resist material is first applied with a spinner or the like on a substrate hydrophobilized by the hydrophobilization method according to the first embodiment, and then heated at 80 to 150° C. for 40 to 120 sec and preferably for 60 to 90 sec to form a resist film. It is to be noted that an inorganic bottom antireflective coating (inorganic BARC) or an organic bottom antireflective coating (organic BARC) may be formed on the substrate.

The resist material is not particularly limited, and negative and positive type resist materials, as well as conventionally well-known resist materials may be appropriately used. Such resist materials may include (i) positive type resist materials containing a naphthoquinone diazide compound and a novolak resin, (ii) positive type resist materials containing a compound which generates acid by exposure to light, a compound which increases the solubility in the alkali solution by the action of the acid, and an alkali-soluble resin, (iii) positive type resist materials containing a compound which generates acid by exposure to light, and an alkali-soluble resin having a group which increases the solubility in the alkali aqueous solution by the acid, and (iv) negative type resist materials containing a compound which generates acid by light, a crosslinking agent and an alkali-soluble resin.

Next, a resist protective film forming material is applied with a spinner or the like on the resist film as needed, and heated at 80 to 150° C. for 40 to 120 sec, and preferably 60 to 90 sec to form a resist protective film. The resist protective film forming material is not particularly limited, and a conventionally well-known resist protective film forming material may be appropriately used as long as it includes a fluorine-containing resin, and can prevent deterioration of the resist film due to the liquid immersion medium, and deterioration of the liquid immersion medium due to elution of the component from the resist film.

Next, a liquid immersion medium is placed between the objective lens of the lithography device and the resist film (or resist protective film), and exposure (immersion exposure) is carried out in this state, through or not through a desired mask pattern. As the lithography device, for example, liquid immersion exposure devices manufactured by Nikon Corporation, and ASML may be used. When a substrate hydrophobilized by the hydrophobilization method according to the present invention is used, running of water around the edge portion (outer edge) or the back face of the substrate can be prevented even when exposure is carried out.

The liquid immersion medium is preferably a solvent having a refractive index larger than the refractive index of air. Examples of the solvent include water, fluorocarbon inert liquids, silicon-based solvents, and the like. Specific examples of the fluorocarbon inert liquid include liquids containing a fluorocarbon compound such as $C_3HCl_2F_5$, $C_4F_9OCH_3$, $C_4F_9OC_2H_5$ or $C_5H_3F_7$ as a principal component. The fluorocarbon inert liquid has a boiling point of preferably 70 to 180° C., and more preferably 80 to 160° C. Among these, water is preferred in light of handlability and the like.

Also, the exposure light is not particularly limited, and radiation from the light sources such as a KrF excimer laser, an ArF excimer laser, an $F_2$ excimer laser, EUV (extreme ultraviolet ray), VUV (vacuum ultraviolet ray), EB (electron beam), an X-ray, and a soft X-ray may be used.

Subsequently, the exposed substrate is heated at 80 to 150° C. for 40 to 120 sec, and preferably 60 to 90 sec. Next, after the resist protective film is removed as needed, an alkaline developer, for example, a 0.1 to 10% by mass aqueous tetramethylammoniumhydroxide (TMAH) solution is used to subject the resist film to a development process. Thereafter, drying is carried out to obtain a resist pattern.

Second Embodiment

Surface Treatment Method

The surface treatment method according to the second embodiment includes the steps of: subjecting the surface of a resin pattern provided on a substrate, or an etched pattern formed on a substrate by etching, to a treatment with a surface treatment liquid containing a silylating agent and a solvent; and washing the resin pattern or the etched pattern treated with the surface treatment liquid.

Although the resin pattern is not particularly limited, a resin pattern formed by applying a conventionally well-known photosensitive resin composition on a substrate, followed by exposure and development, and the like may be exemplified. The photosensitive resin composition may be either of a positive type or of a negative type, and may be either of a chemically amplified type or of a nonchemically amplified type.

Although the etched pattern is not particularly limited, a pattern formed by etching a substrate using the resin pattern described above as a mask may be exemplified. In addition, the material entity of the etched pattern may include silicon, silicon nitride, titanium nitride, tungsten, and the like.

In general, after the resin pattern as described above is formed, development residues and the attached developing solution are generally washed away and removed off with a washing liquid such as water, a surfactant containing washing liquid, etc. In addition, also after the etched pattern is formed, the pattern surface is generally washed with a washing liquid such as SPM (sulfuric acid.hydrogen peroxide solution), APM (ammonia.hydrogen peroxide solution), etc.

To the contrary, in the surface treatment method according to the second embodiment, the pattern surface is treated with a surface treatment liquid (described later) to hydrophobilize the pattern surface before the resin pattern or the etched pattern is thus washed.

In this regard, a force F that acts during washing between patterns such as the resin pattern and the etched pattern is represented by the following formula (I). In the formula (I), $\gamma$ represents a surface tension of the washing liquid; $\theta$ represents a contact angle of the washing liquid; A represents an aspect ratio of the pattern; and D represents a distance between side walls of the pattern.

$$F = 2\gamma \cdot \cos\theta \cdot A/D \quad (I)$$

Therefore, if the contact angle of the washing liquid can be increased by hydrophobilizing the pattern surface, the force that acts between the patterns during the following washing can be reduced, whereby pattern collapse can be prevented.

This surface treatment is carried out by immersing the substrate on which a resin pattern or an etched pattern is formed into the surface treatment liquid, or applying or spraying the surface treatment liquid on the resin pattern or the etched pattern. The treatment time period is preferably 1 to 60 sec. Also, after this surface treatment, the contact angle of water on the pattern surface is preferably 40 to 120 degree, and more preferably 60 to 100 degree.

After completing the aforementioned surface treatment, the resin pattern or the etched pattern is washed. In this washing treatment, a washing liquid which has been conventionally used in washing treatments of resin patterns and etched patterns may be directly employed. For example, water, a surfactant containing washing liquid and the like are exemplified in the case of resin patterns, whereas SPM, APM, and the like are exemplified in the case of etched patterns.

It is to be noted that the surface treatment and the washing treatment are preferably continuously carried out in light of the throughput. Thus, the surface treatment liquid is preferably selected to have superior replaceability with the washing liquid.

Surface Treatment Liquid

The surface treatment liquid in the second embodiment contains a silylating agent and a solvent. Hereinafter, each component will be explained in detail.

Silylating Agent

The silylating agent is not particularly limited, and any silylating agent which is conventionally well-known may be used. For example, the silylating agent described above in the first embodiment may be used.

Solvent

The solvent is not particularly limited, and a conventionally well-known solvent may be used as long as it can dissolve the silylating agent and is less likely to cause damage on the resin pattern or the etched pattern to be a subject of the surface treatment.

Specific examples include: sulfoxides such as dimethyl sulfoxide; sulfones such as dimethylsulfone, diethylsulfone, bis(2-hydroxyethyl)sulfone, tetramethylenesulfone, and the like; amides such as N,N-dimethylformamide, N-methylformamide, N,N-dimethylacetamide, N-methylacetamide, N,N-diethylacetamide, and the like; lactams such as N-methyl-2-pyrrolidone, N-ethyl-2-pyrrolidone, N-propyl-2-pyrrolidone, N-hydroxymethyl-2-pyrrolidone, N-hydroxyethyl-2-pyrrolidone, and the like; imidazolidinones such as 1,3-dimethyl-2-imidazolidinone, 1,3-diethyl-2-imidazolidinone, 1,3-diisopropyl-2-imidazolidinone, and the like; dialkyl ethers such as dimethyl ether, diethyl ether, methylethyl ether, dipropyl ether, diisopropyl ether, dibutyl ether, and the like; dialkyl glycol ethers such as dimethyl glycol, dimethyl diglycol, dimethyl triglycol, methylethyl diglycol, diethyl glycol, and the like; ketones such as methylethylketone, cyclohexanone, 2-heptanone, 3-heptanone, and the like; terpenes such as p-menthane, diphenyl menthane, limonene, terpinene, bornane, norbornane, pinane, and the like; and the like.

Among these, dialkyl glycol ethers and terpenes are preferred in light of surface treatment effect and replaceability with the washing liquid. These solvents may be used alone, or in combinations of two or more.

EXAMPLES

Hereinafter, the present invention will be explained in detail by way of Examples. It should be noted that the present invention is not in anyway limited to the following Examples.

Examples 1 to 4, and Comparative Examples 1 and 2

As a silylating agent N,N-dimethylaminotrimethylsilane (DMATMS) was used, which was diluted in n-heptane, n-decane, p-menthane, pinane, cyclohexanone, or propylene glycol monomethyl ether acetate (PGMEA) to give 1% by mass, whereby a surface treatment liquid was prepared. This surface treatment liquid was set in an EBR application nozzle of a coater, and spin-coated on an 8-inch silicon wafer rotating at 1,000 rpm to permit hydrophobilization of the silicon wafer. Then, using Dropmaster 700 (manufactured by Kyowa Interface Science Co., LTD.), a droplet of pure water (2.5 µL) was dropped on the applied portion and the contact angle was measured. The results are shown in Table 1.

Comparative Example 3

As a silylating agent N,N-dimethylaminotrimethylsilane (DMATMS) was used, which was set into an HMDS treatment unit of a resist coater SK-W80A (manufactured by Dainippon Screen Manufacturing Co., Ltd.) to permit hydrophobilization of an 8-inch silicon wafer under vapor heating condition at 90° C. for 30 sec. Then, the contact angle was measured when a droplet of pure water was dropped in a similar manner to Example 1. The results are shown in Table 1.

Examples 5 to 8, and Comparative Examples 4 and 5

Hydrophobilization of an 8-inch silicon wafer was permitted and the contact angle was measured when a droplet of pure water was dropped, similarly to Examples 1 to 4, and Comparative Examples 1 and 2 except that hexamethyldisilazane (HMDS) was used as the silylating agent. The results are shown in Table 1.

Comparative Example 6

Hydrophobilization of an 8-inch silicon wafer was permitted and the contact angle was measured when a droplet of pure water was dropped, similarly to Comparative Example 3 except that hexamethyldisilazane (HMDS) was used as the silylating agent. The results are shown in Table 1.

Examples 9 to 12, and Comparative Examples 7 and 8

Hydrophobilization of an 8-inch silicon wafer was permitted and the contact angle was measured when a droplet of pure water was dropped, similarly to Examples 1 to 4, and Comparative Examples 1 and 2 except that trimethylsilyloxy-3-penten-2-one (TMSP) was used as the silylating agent. The results are shown in Table 1.

Comparative Example 9

Hydrophobilization of an 8-inch silicon wafer was permitted and the contact angle was measured when a droplet of pure water was dropped, similarly to Comparative Example 3 except that trimethylsilyloxy-3-penten-2-one (TMSP) was used as the silylating agent. The results are shown in Table 1.

Comparative Example 10

With respect to an 8-inch silicon wafer which had not been subjected to hydrophobilization, the contact angle was measured when a droplet of pure water was dropped. The results are shown in Table 1.

TABLE 1

| | Silylating agent | Solvent | Contact angle (degree) with respect to pure water |
|---|---|---|---|
| Example 1 | DMATMS | n-heptane | 76.5 |
| Example 2 | DMATMS | n-decane | 74.9 |
| Example 3 | DMATMS | p-menthane | 74.8 |
| Example 4 | DMATMS | pinane | 73.8 |
| Comparative Example 1 | DMATMS | cyclohexanone | 19.8 |
| Comparative Example 2 | DMATMS | PGMEA | 10.1 |
| Comparative Example 3 | DMATMS | — | 79.1 |
| Example 5 | HMDS | n-heptane | 56.6 |
| Example 6 | HMDS | n-decane | 55.5 |
| Example 7 | HMDS | p-menthane | 54.9 |
| Example 8 | HMDS | pinane | 53.0 |
| Comparative Example 4 | HMDS | cyclohexanone | 21.2 |
| Comparative Example 5 | HMDS | PGMEA | 18.8 |
| Comparative Example 6 | HMDS | — | 68.7 |
| Example 9 | TMSP | n-heptane | 44.7 |
| Example 10 | TMSP | n-decane | 46.0 |
| Example 11 | TMSP | p-menthane | 45.1 |
| Example 12 | TMSP | pinane | 47.4 |
| Comparative Example 7 | TMSP | cyclohexanone | 16.4 |
| Comparative Example 8 | TMSP | PGMEA | 13.2 |
| Comparative Example 9 | TMSP | — | 59.6 |
| Comparative Example 10 | — | — | 2.5 |

As is seen from Table 1, according to Examples 1 to 12 in which the surface treatment liquid containing a silylating agent and a hydrocarbon-based nonpolar solvent was used, the contact angle of pure water was improved equally to Comparative Examples 3, 6 and 9 in which vapor treatment of a silylating agent was permitted. In particular, according to Examples 1 and 2 in which DMATMS was used as the silylating agent, the contact angle was improved as compared to the case in which other silylating agent was used. On the other hand, according to Comparative Examples 1, 2, 4, 5, 7 and 8 in each of which a silylating agent was diluted not in a hydrocarbon-based nonpolar solvent but in cyclohexanone or PGMEA, the contact angle significantly deteriorated as compared with the case in which the same silylating agent was diluted in a hydrocarbon-based nonpolar solvent.

Examples 13 to 20, and Comparative Example 11

As a silylating agent N,N-dimethylaminotrimethylsilane (DMATMS) or hexamethyldisilazane (HMDS) was used, which was diluted in diethyl diglycol (DEDG), p-menthane, dimethyl sulfoxide (DMSO), or cyclohexanone to give 5% by mass, whereby a surface treatment liquid was prepared. This surface treatment liquid was spin-coated on an 8-inch silicon wafer, and a paddle surface treatment was carried out while rotating at 100 rpm for 30 sec, sequentially followed by a washing treatment with ethyl lactate while rotating at 1,000 rpm for 20 sec. Thereafter, the wafer was dried by rotating at 3,000 rpm for 20 sec. Then, using Dropmaster 700 (manufactured by Kyowa Interface Science Co., LTD.), a droplet of pure water (1.5 µL) was dropped on the surface of the wafer, and the contact angle 10 sec after the dropping was measured. The results are shown in Table 2.

It is to be noted that in addition to the surface treatment liquid immediately after the preparation (about 6 min later), surface treatment liquids after being stored at room temperature for a time period of 30 min, 3 hrs, 12 hrs, 24 hrs, and 1 week were also used as the surface treatment liquid.

Additionally, in Comparative Example 11, the contact angle was measured similarly to the method described above on the silicon wafer before permitting the surface treatment.

TABLE 2

| | Silylating agent | Solvent | Contact angle (degree) with respect to pure water | | | | | |
| --- | --- | --- | --- | --- | --- | --- | --- | --- |
| | | | 6 min | 30 min | 3 hrs | 12 hrs | 24 hrs | 1 week |
| Example 13 | DMATMS | DEDG | 83.8 | 83.2 | 82.2 | 82.7 | 83.0 | 82.3 |
| Example 14 | DMATMS | p-menthane | 86.9 | 87.0 | 86.5 | 86.7 | 86.0 | 85.9 |
| Example 15 | DMATMS | DMSO | 77.5 | 77.2 | 76.0 | 73.1 | 71.0 | 72.0 |
| Example 16 | DMATMS | cyclohexanone | 29.0 | 17.2 | 12.1 | 4.3 | 4.5 | 3.6 |
| Example 17 | HMDS | DEDG | 42.5 | 39.1 | 33.1 | 25.0 | 24.5 | 25.1 |
| Example 18 | HMDS | p-menthane | 57.8 | 57.4 | 56.1 | 54.2 | 55.5 | 54.3 |
| Example 19 | HMDS | DMSO | 67.2 | 66.2 | 63.6 | 58.9 | 60.4 | 62.0 |
| Example 20 | HMDS | cyclohexanone | 45.0 | 23.2 | 21.9 | 11.9 | 10.2 | 8.4 |
| Comparative Example 11 | — | — | | | | 2.0 | | |

Moreover, water was applied on an 8-inch silicon wafer while rotating at 1,000 rpm for 20 sec, and subsequently the aforementioned surface treatment liquid was applied thereon. A paddle surface treatment was permitted while rotating at 100 rpm for 30 sec, followed by further subjecting to a washing treatment with ethyl lactate subsequently while rotating at 1,000 rpm for 20 sec. Thereafter, the wafer was dried by rotating at 3,000 rpm for 20 sec. Then, using Dropmaster 700 (manufactured by Kyowa Interface Science Co., LTD.), a droplet of pure water (1.5 μL) was dropped on the surface of the wafer, and the contact angle 10 sec after the dropping was measured. The results are shown in Table 3.

It is to be noted that as the surface treatment liquid a surface treatment liquid immediately after the preparation (about 6 min later) was used.

In addition, evaluation of replaceability was made when compared with the contact angle in the case in which the surface treatment liquid immediately after the preparation (about 6 min later) was used as is shown in Table 2 to categorize: A; one that exhibited a contact angle of no less than 75%, B; one that exhibited a contact angle of no less than 20% and less than 75%, and C; one that exhibited a contact angle of less than 20%.

TABLE 3

| | Silylating agent | Solvent | Evaluation of replaceability |
| --- | --- | --- | --- |
| Example 13 | DMATMS | DEDG | A |
| Example 14 | DMATMS | p-menthane | B |
| Example 15 | DMATMS | DMSO | B |
| Example 16 | DMATMS | cyclohexanone | C |
| Example 17 | HMDS | DEDG | B |
| Example 18 | HMDS | p-menthane | B |
| Example 19 | HMDS | DMSO | B |
| Example 20 | HMDS | cyclohexanone | C |

As is seen from Table 2, hydrophobicity of the silicon wafer was able to be improved in Examples 13 to 20 in which the treatment with the surface treatment liquid containing a silylating agent and a solvent was permitted. Therefore, when the surface treatment of the etched pattern was permitted using this surface treatment liquid, it is believed that increase in the contact angle of the washing liquid results in weakening of the force that acts between patterns, whereby efficacious prevention of the pattern collapse is enabled. In particular, the surface treatment liquid of Example 13 or 14 prepared using N,N-dimethylaminotrimethylsilane as a silylating agent, and diethyl diglycol or p-menthane as a solvent successfully achieved an extremely high contact angle of no less than 80 degree, and also exhibited superior storage stability.

In addition, as is seen from Table 3, the surface treatment liquid of Example 13 prepared using N,N-dimethylaminotrimethylsilane as a silylating agent, and diethyl diglycol as a solvent had superior replaceability with water. Therefore, the surface treatment liquid is believed to be suited for use in continuously carrying out a surface treatment and a washing treatment.

The invention claimed is:

1. A surface treatment liquid comprising at least one silylating agent selected from the group consisting of N,N-dimethylaminotrimethylsilane (DMATMS), hexamethyldisilazane (HMDS) and trimethylsilyloxy-3-penten-2-one (TMSP), and at least one nonpolar solvent selected from the group consisting of n-nonane, methyloctane, n-decane, n-undecane, n-dodecane, menthane and pinane, wherein the surface treatment liquid is in liquid form when applied to a substrate.

2. The surface treatment liquid according to claim 1, wherein the content of the silylating agent is 0.1 to 50% by mass.

3. The surface treatment liquid according claim 1, wherein the silylating agent is N,N-dimethylaminotrimethylsilane (DMATMS).

4. A hydrophobilization method comprising applying on a substrate the surface treatment liquid according to claim 1 to permit hydrophobilization.

5. The hydrophobilization method according to claim 4, wherein the surface treatment liquid is applied only onto an outer edge of the substrate.

6. A surface treatment method comprising:
   subjecting a surface of a resin pattern provided on a substrate, or an etched pattern formed on a substrate by etching, to a treatment with the surface treatment liquid according to claim 1; and
   washing the resin pattern or the etched pattern treated with the surface treatment liquid.

7. The surface treatment method according to claim 6, wherein the content of the silylating agent in the surface treatment liquid is 0.1 to 50% by mass.

8. The surface treatment method according to claim 6, wherein the silylating agent is N,N-dimethylaminotrimethylsilane (DMATMS).

* * * * *